United States Patent
Hayakawa

(10) Patent No.: US 7,365,425 B2
(45) Date of Patent: Apr. 29, 2008

(54) HEAT RADIATION STRUCTURE OF SEMICONDUCTOR ELEMENT AND HEAT SINK

(75) Inventor: Makoto Hayakawa, Tokyo (JP)

(73) Assignee: NEC Corporation, Tokyo (JP)

( * ) Notice: Subject to any disclaimer, the term of this patent is extended or adjusted under 35 U.S.C. 154(b) by 485 days.

(21) Appl. No.: 11/008,157

(22) Filed: Dec. 10, 2004

(65) Prior Publication Data

US 2005/0174740 A1     Aug. 11, 2005

(30) Foreign Application Priority Data

Dec. 18, 2003     (JP)     ............... 2003-420830

(51) Int. Cl.
*H01L 23/34*     (2006.01)
(52) U.S. Cl. ...................... 257/712; 257/713
(58) Field of Classification Search ................ 257/712, 257/713, 718
See application file for complete search history.

(56) References Cited

U.S. PATENT DOCUMENTS 5,969,950 A  * 10/1999  Tantoush ..................... 361/704
6,275,381 B1 * 8/2001  Edwards et al. ............ 361/717

FOREIGN PATENT DOCUMENTS

JP          4-167455      6/1992
JP          5-62048       8/1993

* cited by examiner

*Primary Examiner*—Roy Potter
(74) *Attorney, Agent, or Firm*—Foley & Lardner LLP

(57)     ABSTRACT

According to a heat radiation structure of a semiconductor element of the invention, by providing a recess for a thermal conductive sheet on the bottom surface of a mounting seat of a heat sink, disposing the thermal conductive sheet in this recess, and screwing a source electrode of a power FET on the bottom surface of the mounting seat of the heat sink, it is possible to efficiently radiate the heat generated by the semiconductor element without damaging semiconductor chips in the interior of the semiconductor element and without deteriorating electrical properties.

7 Claims, 6 Drawing Sheets

Properties dependent on grounding condition-Kfactor at 100 MHz

HEAT RADIATION STRUCTURE OF SEMICONDUCTOR ELEMENT AND HEAT SINK

BACKGROUND OF THE INVENTION

1. Field of the Invention

The present invention relates to a heat radiation technique of a semiconductor element and, more particularly, to a heat radiation technique for a high-output semiconductor element such as a power FET (field effect transistor).

2. Description of the Related Art

In radio communication systems such as W-CDMA (Wideband Code Division Multiple Access), power FETs of hundreds of watts class are used in sending radio waves.

In the design of a power amplifier in which such high-output semiconductor elements, such as power FETs of hundreds of watts class, are used, how efficiently the heat generated by the semiconductor elements that are used is radiated becomes a very important problem. This is because if heat radiation is insufficient and heat is stored in the interior of semiconductor elements, the semiconductor elements cause deterioration in electrical properties, for example, it becomes impossible to obtain a sufficient saturation output and in some cases the semiconductor elements are damaged by heat.

In general, in order to obtain a sufficient heat radiation effect, a power FET of hundreds of watts class is not of a surface mount type structure and has such a structure that the rear surface of a source electrode of the power FET can come into direct contact with a heat sink attached outside the power FET. In general, however, the rear surface of a source electrode is not excellent in flatness and micro irregularities are present on the rear surface of a source electrode. Therefore, if the rear surface of a source electrode is brought into contact with a heat sink as it is and the rear surface is screwed, the air enters gaps formed by the micro irregularities, posing the problem that a sufficient heat radiation effect cannot be obtained.

As techniques for solving this problem and improving heat radiation characteristics, there have been proposed a technique that involves soldering the rear surface of a source electrode of a power FET to a heat sink and a technique that involves applying a thermal grease to between the rear surface of a source electrode of a power FET and a heat sink (for example, Japanese Utility Model Laid-Open No. 5-62048 and Japanese Patent Laid-Open No. 4-167455).

However, the above-described technique that involves soldering has the problem that this technique is not suitable for mass production, because the work of soldering the surface of a source electrode to a heat sink having a large surface area cannot be easily performed. Also, the above-described technique that involves applying a thermal grease has the problem that this technique is not suitable for mass production because the application amount and application area of the thermal grease, etc. have a critical effect on heat radiation characteristics and electrical properties, and has the problem that it is difficult to ensure long-period reliability of the thermal grease.

On the other hand, a structure of a power FET that does not use the above-described soldering or thermal grease and is attached by inserting a thermal conductive sheet excellent in thermal conductivity between the power FET and a heat sink is proposed in the Japanese Patent Laid-Open No. 11-204700, for example.

An appearance view of a general power FET is shown in FIG. 1. An example of a heat radiation structure of a conventional power FET is shown in FIG. 2 to FIG. 5. FIG. 2 is an appearance perspective view of a conventional power FET. FIG. 3 is an assembly drawing of a conventional power FET. FIG. 4 and FIG. 5 are each a sectional view taken along the line VII-VII of FIG. 2.

In FIG. 2 to FIG. 5, a power FET 1, which is a semiconductor element, is the power FET of FIG. 1. The power FET 1 is constituted by a case 1A in the shape of a rectangular parallelepiped, a gate electrode 2A that is a metal plate provided so as to project from a side of this case 1A, a drain electrode 2B that is a metal plate provided so as to project from a side on the side opposite to the gate electrode 2A of the case 1A, and a source electrode 3 that is a metal plate provided on the bottom surface of the case 1A. The source electrode 3 projects from both sides that are orthogonal to the side on which the gate electrode 2A and the drain electrode 2B are provided, and ends 3A of the source electrode 3 are each provided with a recess (a notched part) 3B through which a screw 4 pierces.

In a substrate 5, a circuit pattern 5A that actuates the power FET 1 is formed and an opening 5B through which the power FET 1 is inserted is provided.

A heat sink 6 made of metal such as aluminum is provided, on a mounting surface 6B on the side opposite to a radiation fin 6A, with a mounting seat (spot facing) 7 for the height adjustment of the power FET 1 and the substrate 5 upon mounting of the power FET 1.

When the flatness of a rear surface 3C of the source electrode 3 is excellent in an ideal case, the power FET 1 is mounted in such a manner that the rear surface 3C of the source electrode 3 comes into direct contact with the heat sink 6 via the opening 5B of the substrate 5, and the power FET 1 is fixed by use of the screws 4 so that the source electrode 3 is pushed against the mounting seat 7 of the heat sink 6. The gate electrode 2A and the drain electrode 2B are soldered to the circuit pattern 5A on the substrate 5.

At this time, in general, the rear surface 3C of the source electrode 3 of the power FET has low flatness and the air enters gaps formed by micro irregularities, with the result that it is impossible to perform sufficient heat radiation only by pushing the source electrode 3 by means of the screws 4. For this reason, in many cases, a thermal conductive sheet 8 formed from an elastic member having good thermal conductivity is inserted between the source electrode 3 and the heat sink 6.

The thermal conductive sheet 8 is worked to have a shape that ensures that the thermal conductive sheet 8 comes into contact with the whole area of the rear surface 3C of the source electrode 3. In a case where as shown in FIG. 5, a thermal conductive sheet 8A does not come into contact with the whole area of the rear surface 3C of the source electrode 3 and is brought into contact with only part of the rear surface 3C of the source electrode 3, if screw torques as indicated by the arrows are applied, then because of the presence of gaps 8B, only the area of the thermal conductive sheet 8A rises due to the thickness of the thermal conductive sheet 8A. The reason why the thermal conductive sheet 8 is worked so as to come into the whole area of the rear surface 3C is that nonconformities such as damage to semiconductor chips in the interior of the power FET 1 are prevented thereby from occurring as a result of the occurrence of deformation strains in the power FET due to the gaps 8B.

In addition to such a heat radiation structure as described above, heat radiation methods, such as soldering the source electrode 3 and the heat sink 6 together or applying a thermal grease to between the source electrode 3 and the heat sink 6, have hitherto been adopted.

However, the conventional technique that involves the power FET and a heat sink are brought into electrical contact with each other via a thermal conductive sheet had the problem that the electrical properties of the power FET deteriorates due to the electric resistance of the thermal conductive sheet.

Although a member of low electric resistance is used as a thermal conductive sheet, the member is not a perfect electrical conductor. For this reason, a thermal conductive sheet has not a little electric resistance. The presence of this electric resistance promotes the feedback from the drain to gate of the FET, leading to deterioration in electrical properties, for example, an abnormal oscillation of the FET.

As a technique using a thermal conductive sheet, it is possible to consider a technique in which the shape of the thermal conductive sheet is not such that the thermal conductive sheet is provided on the whole area of the rear surface of the source electrode of a power FET and instead the thermal conductive sheet has such a small shape that the thermal conductive sheet becomes into contact with a position corresponding to the semiconductor chip portion in the interior of the FET where heat is especially concentrated. However, even with this technique, in a case where the grounding of the power FET is performed by screwing, screwed portions rise a little due to the thickness of the thermal conductive sheet and hence it is impossible to perform complete grounding. Also, if grounding is forcedly performed by the torque of screwing, the power FET will be deformed, causing problems such as the cracking of semiconductor chips in the interior of the power FET.

Incidentally, the applicant could not discover prior art literature related to the present invention other than the prior art literature specified in the information on prior art literature described in this specification until the date of application.

SUMMARY OF THE INVENTION

The object of the invention is to provide a heat radiation structure of a semiconductor element and a heat sink that eliminate the above problems and can radiate heat efficiently without damaging semiconductor chips in the interior of the semiconductor element and without causing deterioration in electrical properties.

To achieve this object, a heat radiation structure of a semiconductor element related to the invention includes: an electrically conductive heat sink that has a recess on a mounting surface to which a semiconductor element is fixed; a thermal conductive sheet that transfers heat from the semiconductor element to the heat sink by being put into the recess and coming into contact with part of the semiconductor element; and a semiconductor element having a surface of contact with the mounting surface that is formed from a first electrode (for example, a source electrode 3 in the power FET of FIG. 1), the semiconductor element being fixed to the mounting surface, with the thermal conductive sheet sandwiched, and with part of the first electrode being in close contact with the thermal conductive sheet and another part of the first electrode being in electrical contact with the mounting surface of the heat sink.

The heat radiation structure may be such that it further includes a substrate that has an opening into which the semiconductor element is inserted and in which a circuit pattern that is electrically connected to one or more second electrodes (for example, a gate electrode 2A and a drain electrode 2B in the power FET of FIG. 1) provided in a manner projecting from a side of the semiconductor element is formed in a peripheral part of the opening, the semiconductor element being inserted into the opening of the substrate and fixed to the mounting surface, with the second electrode in contact with the circuit pattern, and after that, the second electrode and the circuit pattern being soldered together.

Furthermore, the heat radiation structure may be such that the recess is formed on a bottom surface of a mounting seat formed in concave form on the mounting surface and the semiconductor element is fixed to the bottom surface of the mounting seat.

A heat sink related to the invention is an electrically conductive heat sink used in a heat radiation structure that radiates heat by conducting heat from a semiconductor element to the heat sink via the thermal conductive sheet, in which the semiconductor element having a contact surface formed from an electrode is fixed to the mounting surface of the heat sink, with the thermal conductive sheet sandwiched, and with the mounting surface having a recess into which the thermal conductive sheet that comes into close contact with part of the electrode is inserted and coming into electrical contact with another part of the electrode of the mounted semiconductor.

The heat sink may be such that the recess is formed on the bottom surface of the mounting seat formed in concave form on the mounting surface to fix the semiconductor element.

As described above, according to a heat radiation structure of a semiconductor element and a heat sink of the invention, because a thermal conductive sheet is put into a recess for height adjustment that is provided on the mounting surface of the heat sink, deformation strains of the semiconductor element due to the thickness of the thermal conductive sheet are suppressed during screwing, with the result that the heat sink and the electrode of the semiconductor element come into direct electrical contact with each other and that the heat from the semiconductor is efficiently radiated to the heat sink via the thermal conductive sheet.

Therefore, heat can be efficiently radiated without damaging the semiconductor chips in the interior of the semiconductor element and without causing deterioration in electrical properties.

BRIEF DESCRIPTION OF THE DRAWINGS

The above and other objects, features and advantages of the present invention will become more apparent from the following detailed description when taken in conjunction with the accompanying drawings wherein.

DETAILED DESCRIPTION OF THE PREFERRED EMBODIMENTS

Preferred embodiments of the present invention will be described below in detail with reference to the drawings.

Figure 1:
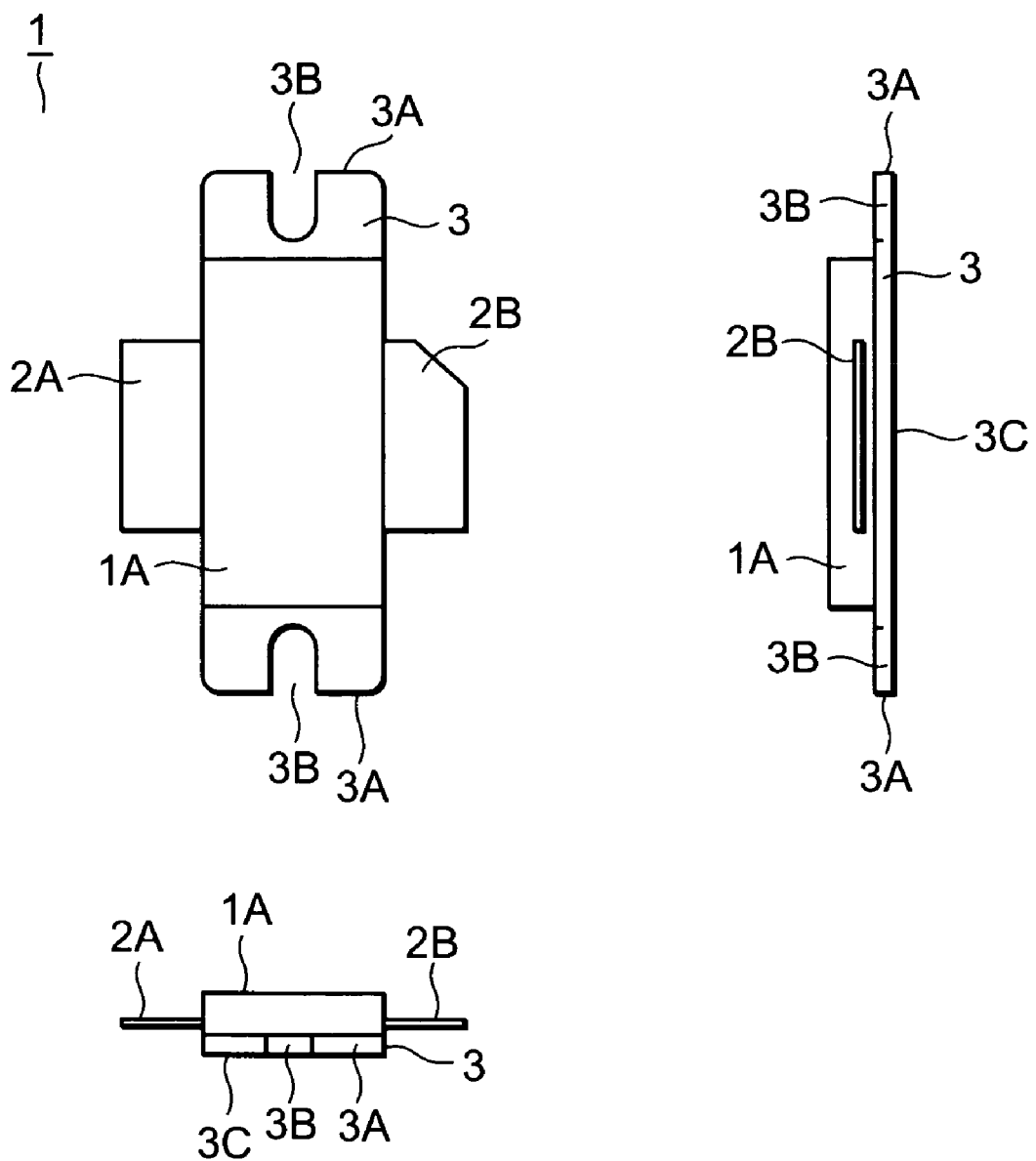
FIG. 1 is an appearance view of a general power FET.
Figure 2:
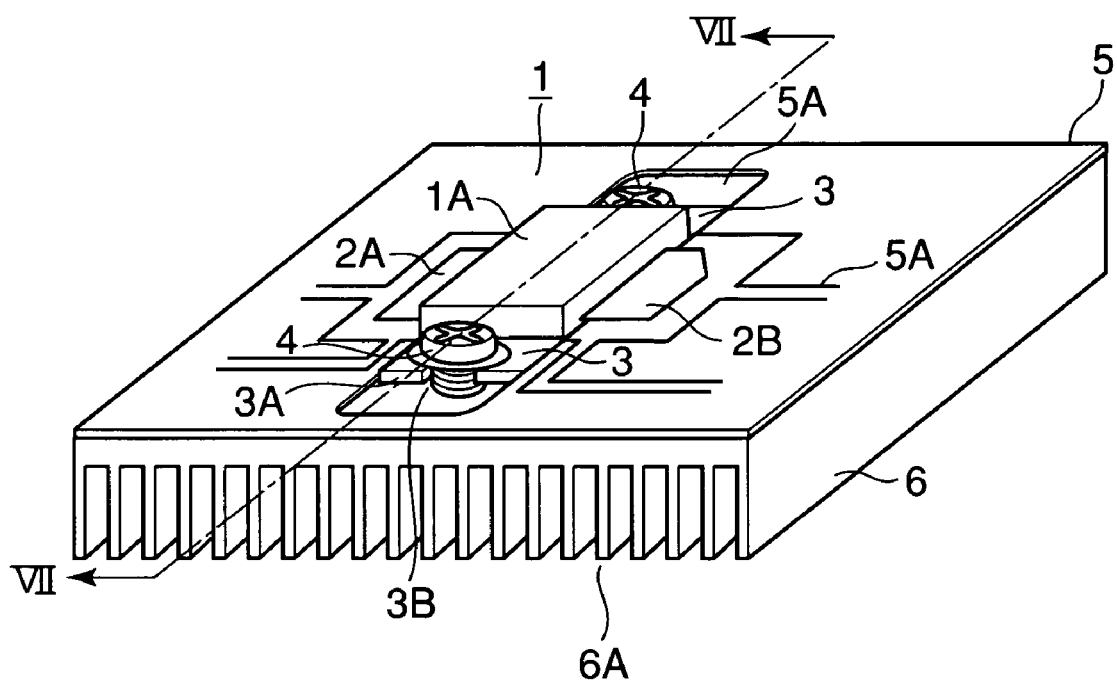
FIG. 2 is a perspective view of a heat radiation structure of a conventional power FET.
Figure 3:
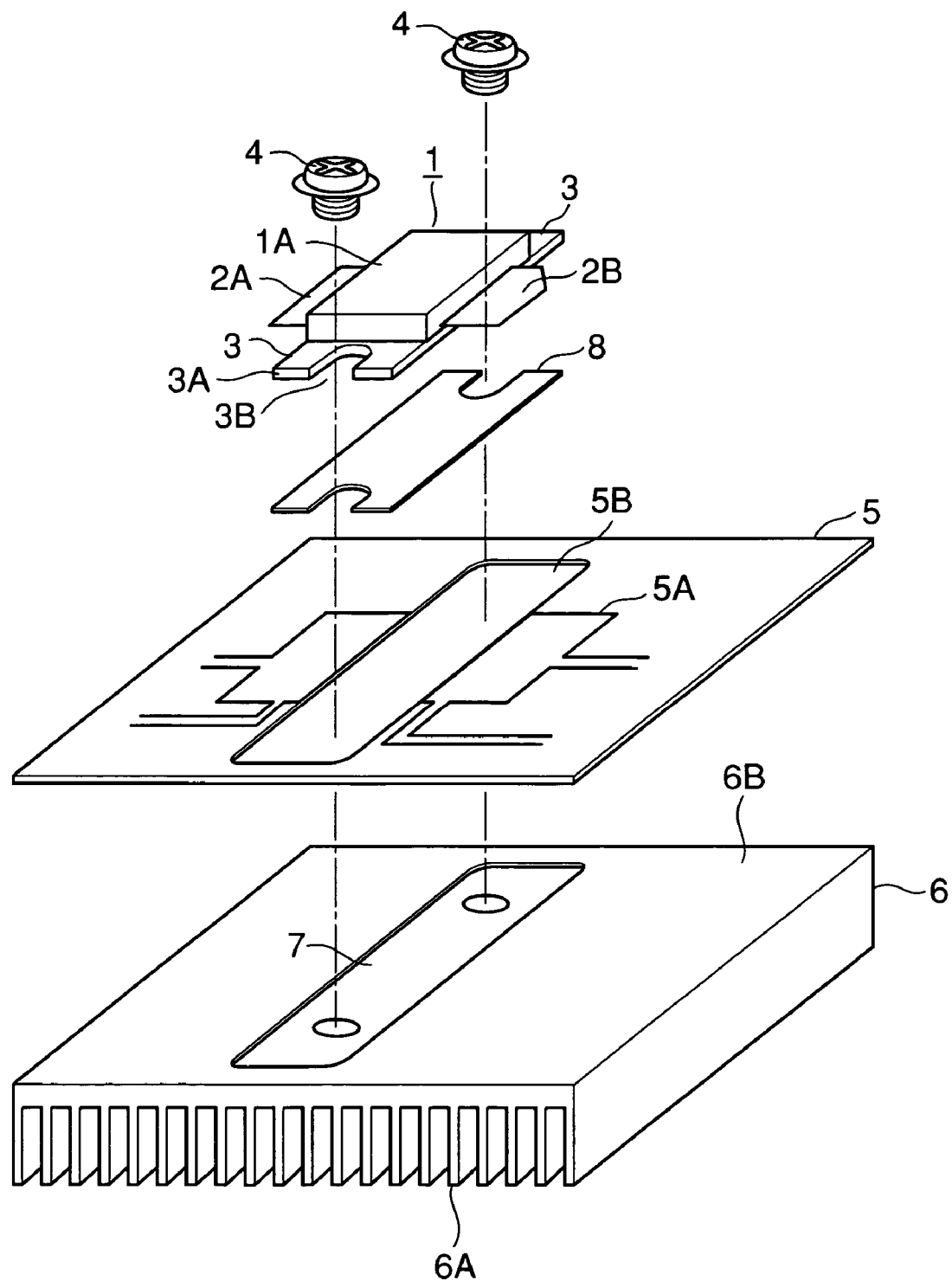
FIG. 3 is an assembly drawing of a heat radiation structure of a conventional power FET.
Figure 4:
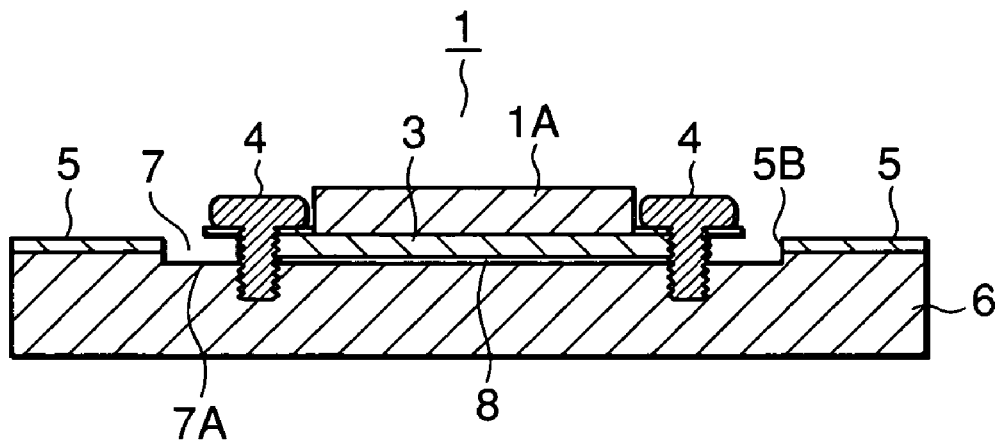
FIG. 4 is a sectional view of the heat radiation structure of the conventional power FET taken along the line VII-VII of FIG. 2.
Figure 5:
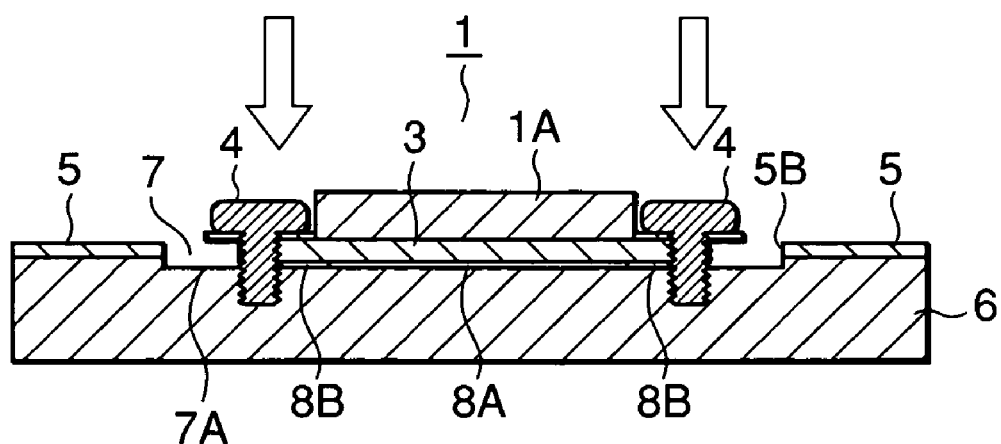
FIG. 5 is a sectional view of another heat radiation structure of a conventional power FET taken along the line VII-VII of FIG. 2.

First, with reference to FIGS. 6 and 7, a radiation structure of a semiconductor element in an embodiment of the invention will be described. Here the general power FET shown in FIG. 1 is used as a semiconductor element.

Figure 6:
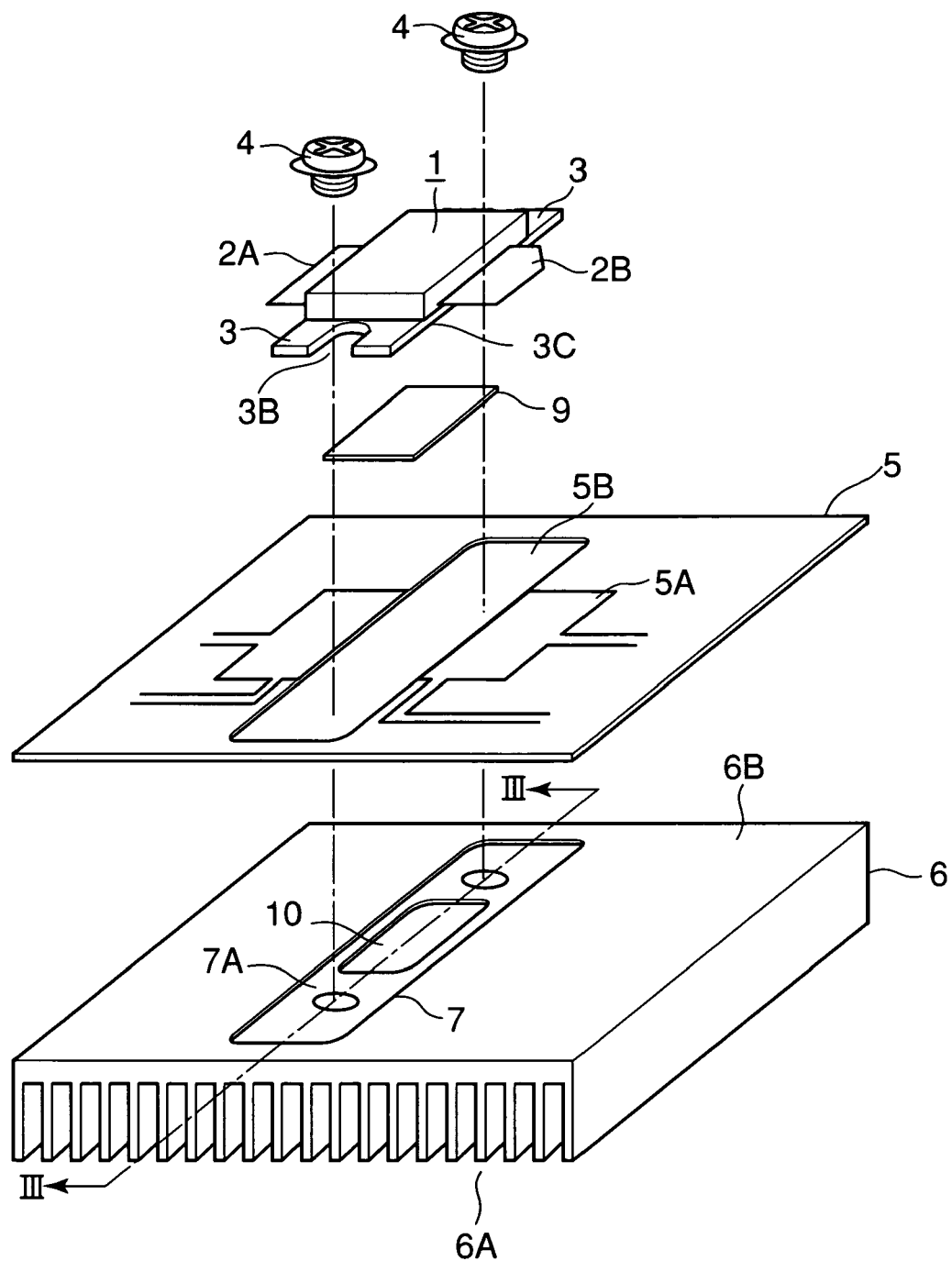
FIG. 6 is an assembly drawing of a heat radiation structure of a power FET in an embodiment of the invention.
Figure 7:
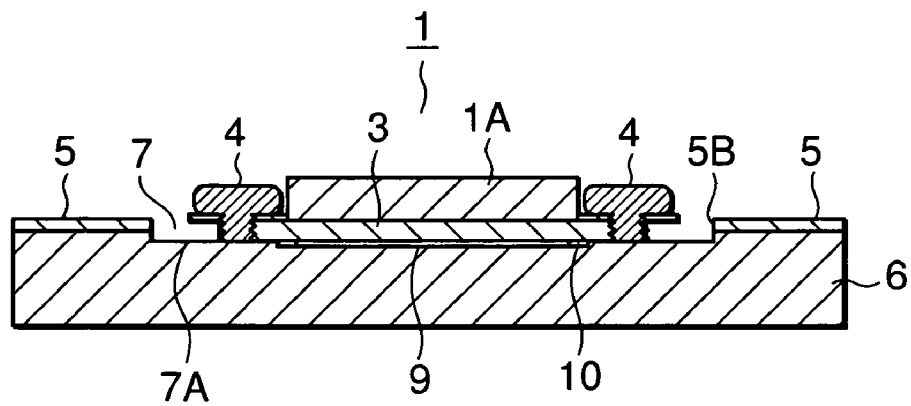
FIG. 7 is a sectional view taken along the line III-III of FIG. 6.

FIG. 6 is an assembly drawing of a heat radiation structure of a power FET in an embodiment of the invention. FIG. 7 is a sectional view taken along the line III-III of FIG. 6, which shows a heat radiation structure in an embodiment of the invention.

In this embodiment, a thermal conductive sheet 9 is put onto the mounting surface 6B of the heat sink 6 of the above-described conventional technique and a recess (spot facing) 10 to adjust the height of the thermal conductive sheet is provided, whereby the heat sink 6 and the source electrode 3 of the power FET 1 are brought into direct electric contact with each other and, at the same time, heat from the power FET 1 is efficiently radiated to the heat sink 6 via the thermal conductive sheet 9. Other components are the same as described above, and like reference numerals refer to like or equivalent parts.

Next, the substrate 5, thermal conductive sheet 9 and heat sink 6 used in this embodiment will be described with reference to FIG. 6.

A circuit pattern 5A that actuates the power FET 1 is formed in the substrate 5, and an opening 5B through which the power FET 1 is inserted is provided in the substrate 5. The thermal conductive sheet 9 is formed from an elastic member having good thermal conductivity such as silicon resin and has an area of a size large enough to come into contact with part of the rear surface 3C of the source electrode 3, for example, a portion having large heat generation, and not the whole of the rear surface 3C of the source electrode 3.

The heat sink 6 is made of metal such as aluminum, and is provided, on a mounting surface 6B on the side opposite to a radiation fin 6A, with a mounting seat (spot facing) 7 for height adjustment between the power FET 1 and the substrate 5 upon mounting of the power FET 1. A bottom surface 7A of a mounting seat 7 is provided with a recess 10 for the height adjustment of the thermal conductive sheet 9 and bottom surface 7A. The depth of this recess 10 is not more than the thickness of the thermal conductive sheet 9, and this depth is determined so as to be able to obtain appropriate stresses to the power FET 1 by the elasticity of the thermal conductive sheet 9, i.e., stresses that are such that the gaps by the micro irregularities on the bottom surface 7A and the rear surface 3C are stopped up and come into close contact with each other. The recess 10 has an area larger than the area over which the thermal conductive sheet 9 extends when pushed against a rear surface 3C of the source electrode 3.

Next, the mounting process of the power FET 1 in this embodiment will be described with reference to FIGS. 6 and 7.

First, the power FET 1 is mounted so that the rear surface 3C of the source electrode 3 comes into direct contact with the heat sink 6 via the opening 5B of the substrate 5, and the rear surface 3C of the source electrode 3 is pushed against the bottom surface 7A of the mounting seat 7 of the heat sink 6 by means of the screws 4 and fixed in direct electrical contact. At this time, the thermal conductive sheet 9 is put into the recess 10 of the heat sink 6 and the thermal conductive sheet 9 is sandwiched between the bottom surface of the recess 10 and the rear surface 3C of the source electrode 3. And the gate electrode 2A and the drain electrode 2B are soldered to the circuit pattern 5A on the substrate 5.

Next, the heat radiation action in the heat radiation structure of the power FET 1 in this embodiment will be described with reference to FIGS. 6 and 7.

Because the depth of the recess 10 of the heat sink 6 is equal to or a little shallower than the thickness of the thermal conductive sheet 9, part of the rear surface 3C and the thermal conductive sheet 9 are brought into close contact with each other by the fastening torques of the screws 4. As a result of this, the space formed by micro irregularities. on the rear surface 3C and the bottom surface of the recess 10 is filled by the thermal conductive sheet 9, and the thermal conductive sheet 9 comes into close contact with both the bottom surface of the recess 10 and the rear surface 3C of the source electrode 3, ensuring sufficient thermal contact between the source electrode 3 and the heat sink 6. For this reason, the heat generated from the power FET 1 can be efficiently radiated in the order: the source electrode 3→the thermal conductive sheet 9→the heat sink 6→the air.

On this occasion an adjustment is made in the recess 10 so that the height of the bottom surface 7A and the height of the thermal conductive sheet 9 become equal. Therefore, deformation strains in the FET 1 due to the thickness of the thermal conductive sheet 9 do not occur anymore during screwing and do not cause damage to semiconductor chips in the interior of the power FET 1, either.

Furthermore, the source electrode 3 of the power FET 1 and the heat sink 6 are pushed against each other by the screws 4 and brought into direct electrical contact with each other in portions other than the recess 10, the source electrode 3 of the power FET 1 and the heat sink obtain an equal electric potential. That is, grounding is sufficiently performed and does not cause deterioration in the electrical properties of the power FET.

By use of a general power FET the present inventor measured the temperature of the source electrode in the output power of the general power FET for both a conventional heat radiation structure in which the thermal conductive sheet comes into contact with the whole area of the rear surface of the source electrode and a heat radiation structure of this embodiment in which the recess 10 is provided in the heat sink 6 and the thermal conductive sheet 9 is put into the recess.

As a result, the temperature was 77.9° C. in the conventional heat radiation structure and 80.4° C. in the heat radiation structure in this embodiment. Thus, almost the same result was obtained for heat radiation. For the electrical grounding effect, because as shown in FIGS. 6 and 7 described above, in the screwed portion of the heat sink 6 there is no recess and there is no thermal conductive sheet 9, either, the rear surface 3C of the source electrode 3 and the heat sink 6 are brought into sufficient contact with each other and the source electrode 3 and the heat sink 6 obtain an equal electric potential. Thus, an electrically sufficient grounding effect was obtained.

Figure 8:
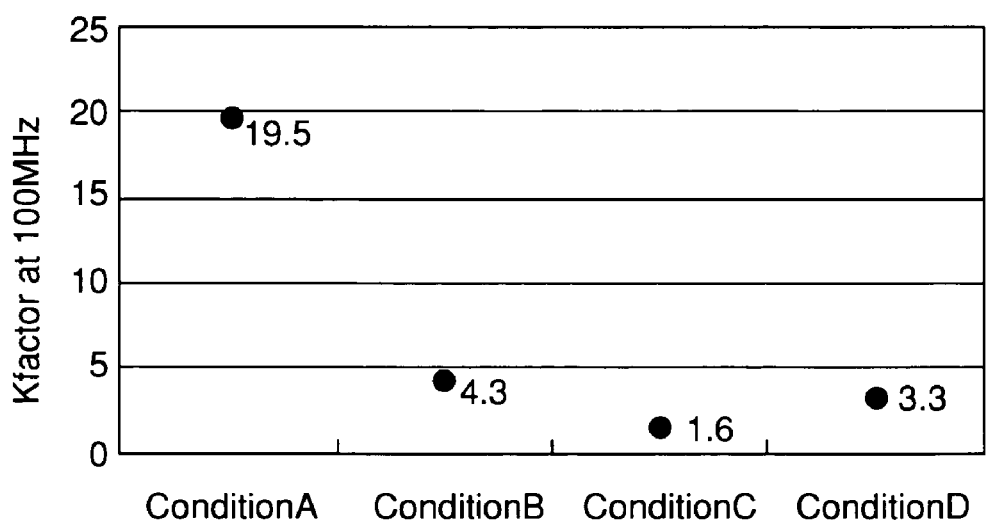
FIG. 8 is graph that shows measurement results of a heat radiation structure in an embodiment of the invention.

For Kfactor, the results shown in FIG. 8 were obtained. FIG. 8 shows measurement results of Kfactor at a frequency of 100 MHz obtained in a general power FET. Kfactor is one of the indices of the stability of a power FET etc. and the larger the value the larger the stability.

In FIG. 8, Condition A denotes a heat radiation structure in which the rear surface of the source electrode 3 is soldered to a heat sink and Condition B denotes a heat radiation structure in which a commercially available thermal grease is applied to the rear surface of the source electrode 3. Also, Condition C denotes a heat radiation structure in which the thermal conductive sheet 9 is in contact with the whole area of the rear surface of the source electrode 3 and Condition D denotes a structure in which the heat sink 6 is provided with the recess 10, into which the thermal conductive sheet 9 is buried, in this embodiment.

From the measurement results, it is apparent that although good Kfactor is obtained in Condition A and Condition B, the heat radiation structures and mounting step are complex as described above and these heat radiation structures little serve practical use. It is apparent that in contrast to this, for Condition C and Condition D in which the heat radiation structures and mounting step are simple and practical applicability is high, Kfactor that is 1.6 in a conventional heat radiation structure (Condition C) in which the thermal conductive sheet 9 comes into contact with the whole area of the rear surface of the source electrode 3 is improved to 3.3, which is almost twice as high as the above value, by adopting a heat radiation structure of this embodiment (Condition D).

As described above, according to the invention, by putting the thermal conductive sheet 9 onto the mounting surface 6B of the heat sink 6 and providing the recess 10 for adjusting the height of the thermal conductive sheet 9, the heat sink 6 and the electrode 3 of the power FET 1 are brought into direct electrical contact with each other. And the heat from the power FET 1 is efficiently radiated to the heat sink 6 via the thermal conductive sheet 9 put into the recess 10, with the result that the heat can be efficiently radiated without damaging semiconductor chips in the interior of the power FET and without causing deterioration in electrical properties.

Incidentally, in a case where the mounting seat 7 is unnecessary, for example, when the circuit is not connected to the electrodes 2A, 2B by use of the substrate 5, the recess 10 may be formed directly in the mounting surface 6B of the heat sink 6. Also in this case, the same operation and effect as described above can be obtained.

Furthermore, although the above descriptions were given by using the heat radiation structures of power FET used in W-CDMA etc. as an example, the invention is not limited to them and this embodiment can also be applied to heat radiation structures of semiconductor elements such as high-output general bipolar transistors and the same operation and effect as described above can be obtained.

While this invention has been described in connection with certain preferred embodiments, it is to be understood that the subject matter encompassed by way of this invention is not to be limited to those specific embodiments. On the contrary, it is intended for the subject matter of the invention to include all alterative, modification and equivalents as can be included within the spirit and scope of the following claims.

What is claimed is:

1. A heat radiation structure of a semiconductor element, comprising:

an electrically conductive heat sink that has a recess on a mounting surface to which a semiconductor element is fixed;

a thermal conductive sheet that transfers heat from said semiconductor element to said heat sink by being put into said recess and coming into contact with part of said semiconductor element; and a semiconductor element having a surface of contact with said mounting surface that is formed from a first electrode, the semiconductor element being fixed to said mounting surface with said thermal conductive sheet sandwiched, and with part of said first electrode being in close contact with said thermal conductive sheet and another part of said first electrode being in electrical contact with the mounting surface of said heat sink.

2. The heat radiation structure of a semiconductor element as claimed in claim 1, wherein the heat radiation structure further comprises a substrate that has an opening into which said semiconductor element is inserted and in which a circuit pattern that is electrically connected to one or more second electrodes provided in a manner projecting from a side of said semiconductor element is formed in a peripheral part of said opening, said semiconductor element being inserted into the opening of said substrate and fixed to said mounting surface, with said second electrode in contact with said circuit pattern.

3. The heat radiation structure of a semiconductor element as claimed in claim 2, wherein said recess is formed on a bottom surface of a mounting seat formed in concave form on said mounting surface and said semiconductor element is fixed to the bottom surface of said mounting seat.

4. The heat radiation structure of a semiconductor element as claimed in claim 2, wherein said second electrode and said circuit pattern are soldered together.

5. The heat radiation structure of a semiconductor element as claimed in claim 3, wherein said second electrode and said circuit pattern are soldered together.

6. An electrically conductive heat sink to which heat from a semiconductor element fixed to a mounting surface is conducted via a thermal conductive sheet, comprising:

a recess into which said thermal conductive sheet that comes into close contact with part of an electrode of said mounted semiconductor element is to be put; and a portion that comes into electrical contact with another part of said electrode of said mounted semiconductor element.

7. The electrically conductive heat sink to which heat from a semiconductor element fixed to a mounting surface is conducted via a thermal conductive sheet as claimed in claim 6, wherein said recess is formed on the bottom surface of the mounting seat formed in concave form on said mounting surface to fix said semiconductor element.

* * * * *